United States Patent
Suzuki

[11] Patent Number: 6,081,072
[45] Date of Patent: Jun. 27, 2000

[54] FILAMENT LAMP FOR WAFER HEATING AND HEATING LIGHT SOURCE

[75] Inventor: Shinji Suzuki, Kawasaki, Japan

[73] Assignee: Ushiodenki Kabushiki Kaisha, Tokyo, Japan

[21] Appl. No.: 09/210,986

[22] Filed: Dec. 15, 1998

[30]     Foreign Application Priority Data

Dec. 12, 1997  [JP]   Japan ..................................... 9-362326

[51] Int. Cl.⁷ ............................. H05B 1/00; F27D 11/00
[52] U.S. Cl. ............................. 315/46; 315/94; 219/405; 219/411
[58] Field of Search .................................. 315/94, 95, 96, 315/97, 98, 99, 100, 101, 46; 313/316, 638, 113, 114; 219/411, 405; 392/407

[56]            References Cited

U.S. PATENT DOCUMENTS

| | | | |
|---|---|---|---|
| 4,511,788 | 4/1985 | Arai et al. ................................ | 219/405 |
| 4,535,228 | 8/1985 | Mimura et al. ........................ | 219/411 |
| 4,578,144 | 3/1986 | Hiramoto ............................. | 156/617 R |
| 4,832,249 | 5/1989 | Ehler ..................................... | 228/102 |
| 5,128,515 | 7/1992 | Tanaka .................................. | 219/390 |
| 5,386,491 | 1/1995 | Mewissen et al. ..................... | 392/418 |
| 5,889,258 | 3/1999 | Lubomirski et al. ................... | 219/405 |

FOREIGN PATENT DOCUMENTS 8-45863   2/1996   Japan .

*Primary Examiner*—Don Wong
*Assistant Examiner*—Wilson Lee
*Attorney, Agent, or Firm*—Nixon Peabody LLP; David S. Safran

[57]            ABSTRACT

A heating light source for a heat treatment device of the light irradiation type with high temperature uniformity on the wafer surface during heating and a small operating current and a lamp which is used for the heating light source. By using a light source in which several annular lamps are arranged concentrically within the same plane the need for a large device due to large currents is obviated. By arranging nonemission parts distributed over the entire peripheral direction of an annular filament lamp and not only on one side, and by arranging these filament light sources in the radial direction of a lamp in which several of these light sources are used distributed and not on one side, the irradiance on the entire wafer surface is made essentially uniform. These nonemission parts have a radiance which is controlled such that the irradiance on the wafer surface directly underneath the region in the vicinity of the insertion tubes in which the filament does not uniformly extend essentially agrees with the irradiance of the wafer surface directly underneath the nonemission parts.

4 Claims, 4 Drawing Sheets

FILAMENT LAMP FOR WAFER HEATING AND HEATING LIGHT SOURCE

BACKGROUND OF THE INVENTION

1. Field of the Invention

The invention relates to a heating light source of a heat treatment device of the light irradiation type in which a semiconductor wafer (hereinafter called a "wafer") is heated by light for layer formation, diffusion, annealing and the like. The invention, furthermore, relates to a heating filament lamp which is used in this heating light source.

2. Description of Related Art

Heat treatment of the light irradiation type in the production of semiconductor wafers is performed in broad areas, as in layer formation, diffusion, annealing and the like.

In each of these treatments, a wafer is heated to a high temperature and treated. If a heat treatment device of the light irradiation type is used for this heat treatment, the wafer can be quickly heated. After a few seconds, the wafer temperature can increase to greater at least 1000° C. Furthermore, cooling can take place quickly when the light irradiation stops.

However, when the wafer is heated, if thermal nonuniformity arises in it, a phenomenon occurs in the wafer which is called "slip" and means errors of dislocation. Here, there is the danger that scrap will be produced.

Therefore, in heat treatment of a wafer using a heat treatment device of the light irradiation type, there is a need to control the amount of light irradiation in order to uniformly increase the wafer temperature.

In a conventional lamp heating device, there are a host of halogen lamps next to one another which are electrically connected in parallel with a uniform spacing relative to one another (honeycomb). The radiance of the respective lamp is regulated. In this way, the amount of radiation emitted for the respective given zone of the wafer is controlled and the wafer is uniformly heated (conventional example 1).

In another conventional lamp heating device, there are several annular IR lamps with different diameters each, arranged concentrically, as described in Japanese patent disclosure document HEI 8-45863. The radiance of the respective zone is changed by the distance between the wafer and lamp being changed in the respective concentric zone. In this way, the wafer temperature is controlled (conventional example 2).

In the device according to conventional example 1, the filament of the respective halogen lamps located next to one another is relatively short. Since there are several such lamps connected in parallel with respect to the power source, the current flowing through the device is enormous when a given power is supplied to the lamps. Therefore, an electrical splitting cable with a large diameter must be used for large currents. Here, it is considered disadvantageous that a large device is needed.

In the device according to the conventional example 2, a light source is used in which there are several annular lamps arranged concentrically to obviate the need for a large device due to the large currents, as in the device according to the conventional example 1. Here, by changing the distance between the lamps and the wafer, the temperature uniformity is enhanced. However, in this lamp, the luminous filament does not extend uniformly in the vicinity of the insertion tubes on the ends of the arc tube. As a result, the wafer surface directly under this area has much weaker irradiance than the wafer surface directly under the filament. It has become increasingly apparent that this great difference in irradiance (difference between greater irradiance and smaller irradiance) is a significant disadvantage in that a uniform wafer surface temperature, which is essential for producing semiconductors, cannot be obtained.

SUMMARY OF THE INVENTION

Therefore, it is a primary object of the present invention is to eliminate the defects of conventional heat treatment devices and to devise a heating light source for a heat treatment device of the light irradiation type which has high temperature uniformity and a small operating current, and with which the temperature difference of the wafer surface is small during heating.

Furthermore, another object of the invention is to devise a heating filament lamp which is used in the heating light source devised in accordance with the preceding object.

As a result of extensive research, the present inventors have discovered the following means for achieving the above objects:

Use of a light source in which several annular filament lamps are arranged concentrically within the same plane obviates the need for a large device due to high currents.

Furthermore, the measure that nonemission parts are distributed in the peripheral direction of the annular filament lamps and are not located on one side enables the difference of irradiance on the wafer surface to be reduced and the wafer surface to be heated to an essentially uniform temperature. Here, the nonemission parts have a radiance which is controlled such that the irradiance on the wafer surface directly underneath the region in the vicinity of the insertion tubes in which the filament does not uniformly extend essentially agrees with the irradiance of the wafer surface directly underneath the nonemission parts.

Additionally, in a light source in which there are several such filament lamps located concentrically within the same plane, these nonemission parts and the areas in the vicinity of the insertion tubes in which the luminous filaments do not uniformly extend are distributed in the radial direction of the light source and are not arranged on one side. This enables the difference of irradiance on the wafer surface to be reduced and the wafer surface to be heated to an essentially uniform temperature.

According to the invention, in a filament lamp for wafer heating in which, within an arc tube comprised of an annular tube and two insertion tubes which project outwardly from the plane which contains the annular tube, these objects are achieved in that the emission parts and the nonemission parts are arranged alternatingly in the filament which is located in the arc tube. Further contributing to the achieving of these objects, in such a filament lamp, in the area of the emission parts, the filament is made as a tightly wound filament coil and in the area of the nonemission parts as an unwound area or more loosely wound filament coil. Also advantageous to the achieving of this first object is the locating of the emission parts of the filament in transition regions from the annular tube to the insertion tubes.

These and further objects, features and advantages of the present invention will become apparent from the following description when taken in connection with the accompanying drawings which, for purposes of illustration only, show several embodiments in accordance with the present invention.

DETAILED DESCRIPTION OF THE INVENTION

Figure 1:
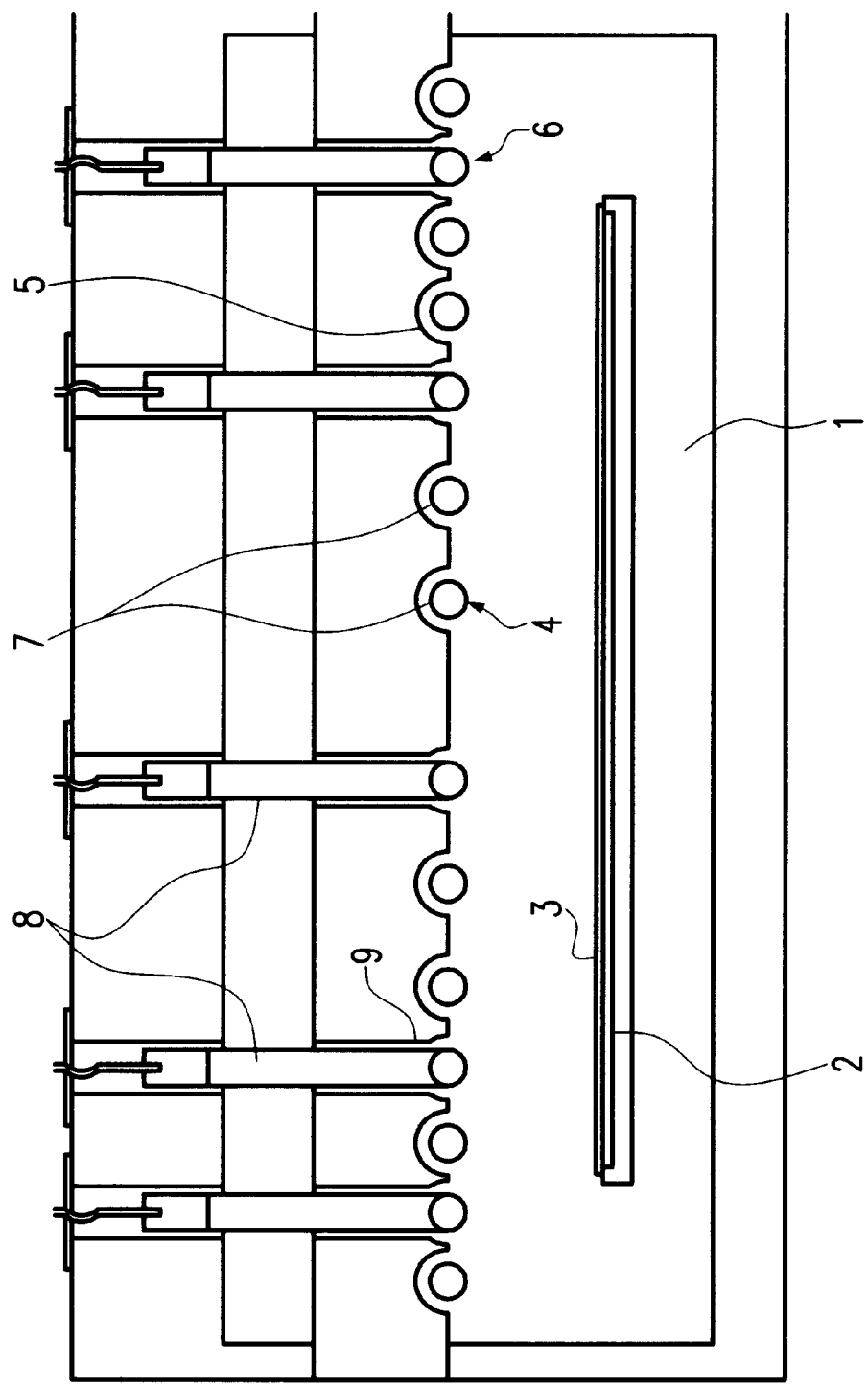
FIG. 1 is a schematic cross section of a heat treatment device of the light irradiation part in which a heating light source according to the present invention is used.

FIG. 1 is a schematic cross section of a heat treatment device of the light irradiation type in which a two-dimensional heating light source in accordance with the present invention is used. In the figure, a device chamber 1 contains a wafer holding plate 2 on which a wafer 3 is placed. Above the wafer 3, there are a plurality of filament lamps 4 for heating the wafer 3, the lamps 4 being arranged such that the annular tubes 7 are concentrically located within the same plane. Above these filament lamps 4 are trough-like mirrors 5 which have a concave cross-sectional shape. Thus, the light radiated in an upward direction is reflected by the mirrors and guided back to the surface of the wafer 3. In this way, a two-dimensional light source 6 is formed. An insertion tube 8 adjoins the annular tube 7 of the filament lamp 4, passes through an opening 9 located in the mirror 5, extends upward and is connected to an outside power source.

Figure 2:
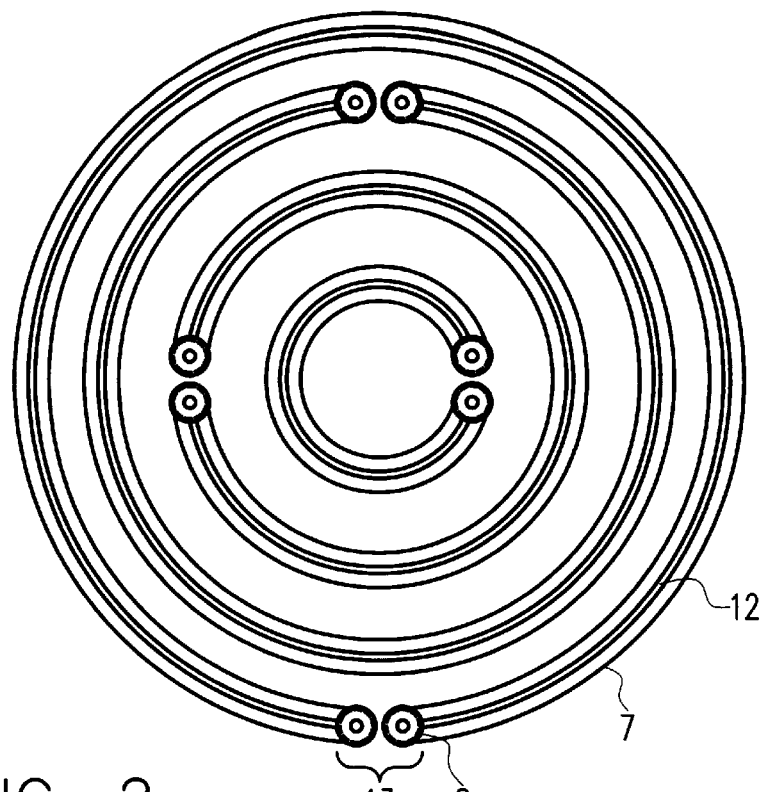
FIG. 2 is a plan view of one example in which a plurality of annular filament lamps, which form a two-dimensional heating light source, are concentrically arranged within the same plane.

FIG. 2 schematically shows one example in which a plurality of annular filament lamps 4 are concentrically located within the same plane to form the two-dimensional light source 6.

In the following, the arrangement of the filament lamp 4, which is used for the two-dimensional light source 6, is described using FIG. 3.

A lamp arc tube 10 is formed of an annular tube 7 and insertion tubes 8 which project outwardly from the plane which contains the annular tube 7. There are sealed portions 11 on the two ends of this arc tube 10. Within the arc tube 10, there is a filament 12 which is provided with emission parts 12a and nonemission parts 12b in an alternating manner, and which is connected to an outside power source via the sealed portions 11.

Figure 3:
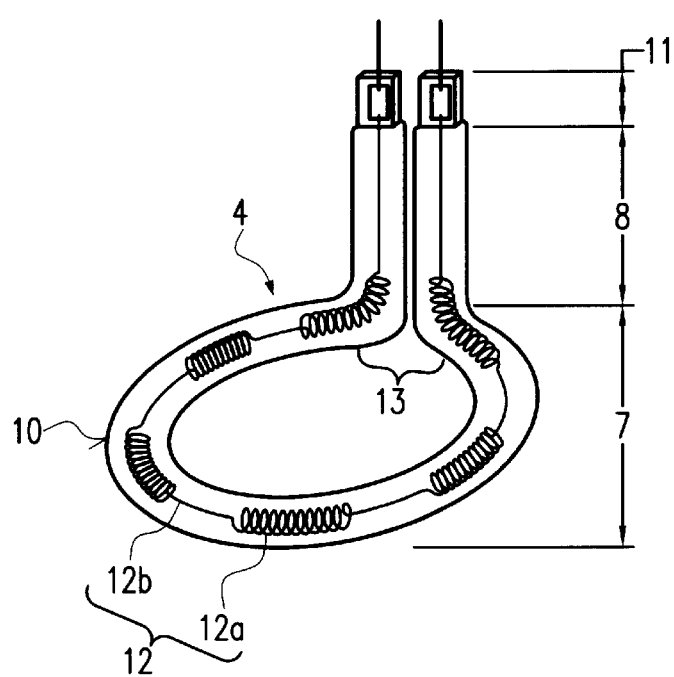
FIG. 3 is a perspective view showing the inside arrangement of a filament lamp which is used for a two-dimensional heating light source.

In the area of the emission parts 12a, the filament 12 can also be made, for example, as a tightly wound filament coil and in the area of the nonemission parts 12b as an unwound area or more loosely wound filament coil (in the area of the nonemission parts in FIG. 3, the filament is made as an unwound area and is essentially linear; this is likewise acceptable).

In this annular filament lamp 4, there are cases in which the irradiance of the wafer surface deceases greatly directly underneath the vicinity of the insertion tubes 8.

This is because of the following:

1. In the vicinity of its ends, the arc tube 10 is bent from the annular tube 7 towards the insertion tubes 8. It can be imagined that the radiation which reaches the wafer surface proceeding from these bending sites is reduced.
2. In no case does the filament 12 extend in the area between the two insertion tubes 8. Therefore, it can be imagined that no radiation can be expected to reach the wafer surface from this area.

This vicinity of the ends of the arc tube 10 and the area between the two annular tubes 8 is called the "area in which there is no filament" herein.

As was described above, in the lamp, only area 13 in which there is no filament has weak radiance. The irradiance of the wafer surface directly underneath this area 13 is somewhat weaker than the irradiance of the other wafer surface. Since the difference of the irradiance on the wafer surface is large, it was found that it causes nonuniformity of the temperature of the wafer surface.

Figure 4:
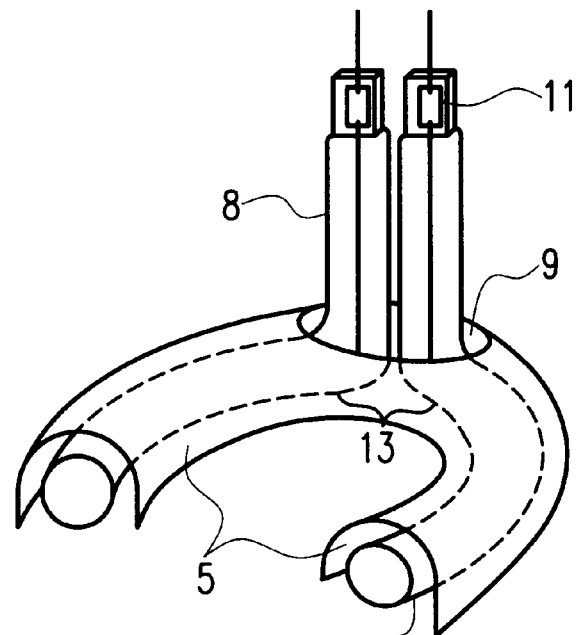
FIG. 4 shows a perspective representation of the relation between the insertion tubes and a trough-like mirror having a concave cross-sectional shape in partial cross section.

Furthermore, the insertion tubes 8 pass through an opening 9 which is located in the mirror 5 above the filament lamp 4, and they are connected to an outside power source, as is illustrated in FIGS. 1 and 4. It was also found that, due to this opening 9, the light radiation is not reflected from the mirror 5, and that, therefore, the irradiance of the wafer surface becomes less directly under the area 13 and the difference of the irradiance increases.

In the filament lamp 4 of the invention, therefore, in the filament 12, there are emission parts 12a and nonemission parts 12b as shown in FIG. 3, as was described above. The radiance of the nonemission parts 12b is controlled such that the irradiance on the wafer surface directly underneath the area 13 essentially agrees with the irradiance of the wafer surface directly underneath the nonemission parts 12b. These nonemission parts 12b are furthermore distributed over the entire periphery of the annular lamp 4 and are not located only on one side.

The difference of the irradiance on the wafer surface becomes less than in the conventional example by the measure that, in the peripheral direction of the filament lamp 4, the emission parts 12a with strong radiance, the nonemission parts 12b with weaker radiance and the area 13 are distributed over the entire periphery in an alternating manner and are not present on one side. This prevents the irradiance from dropping significantly on the wafer surface in the peripheral direction in one part. Therefore, the wafer surface can be heated to a much more uniform temperature.

Furthermore, as illustrated in FIG. 3, the filament can be easily produced by the measure that, in the area of the emission parts 12a, the filament is made as a tightly wound filament coil, and in the area of the nonemission parts 12b, as an unwound area or more loosely wound filament coil.

In addition, as also shown in FIG. 3, the reduction of radiation from the area 13 can be somewhat suppressed by the measure that the emission parts 12a of the filament are arranged to pass from the annular tube 7 into the insertion tubes. Thus, the difference of the irradiance of the wafer surface can be reduced and can contribute to a more uniform temperature.

Figure 5:
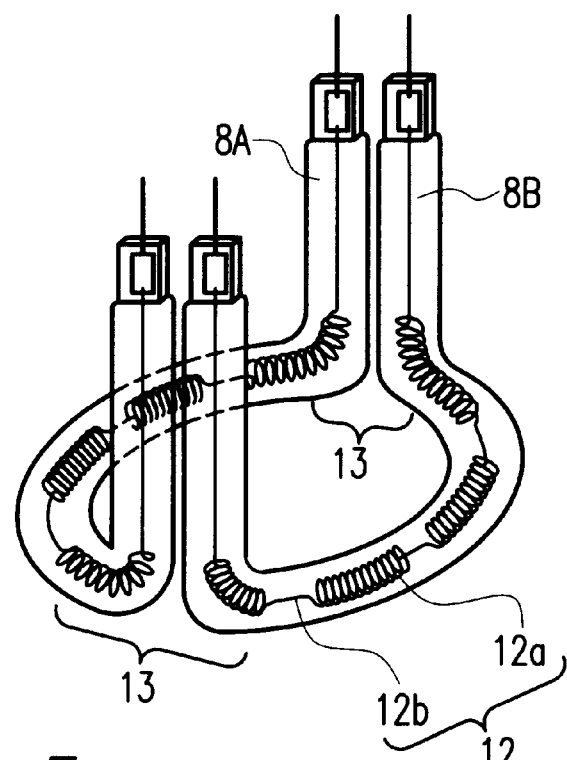
FIG. 5 is a perspective view showing an arrangement of an annular filament lamp which is formed of two semicircular lamps.

A case was described above in which the annular light source is formed of a single annular lamp. However, an annular light source can be produced using two semicircular lamps, as is shown in FIG. 5. Furthermore, an annular light source can also be produced by combining at least three lamps. In these cases as well, between an insertion tube 8A of one lamp and an insertion tube 8B of another lamp which is combined with the aforementioned lamp and which forms an annular light source, and in the vicinity thereof, there is likewise an area with weaker radiance as a result of the absence of the filament, i.e. the area 13, as is shown in FIG. 5.

Therefore, the radiance of the nonemission part 12b of the respective lamp is controlled such that the irradiance on the wafer surface directly underneath area 13 with weaker radiance essentially agrees with the irradiance of the wafer surface directly underneath the nonemission parts 12b. The difference of irradiance on the wafer surface can likewise be reduced by this measure and the wafer surface can be heated to an essentially uniform temperature.

When a light source 6 is used in which annular tubes 7 of several filament lamps 4 are located concentrically within the same plane, both the problem of a considerable decrease of the irradiance of the wafer surface directly underneath the vicinity of the above described insertion tubes 8 and also the problem of a considerable drop of the irradiance in the radial direction as well occur. Therefore, in accordance with the invention, the area 13 and the nonemission parts 12b are arranged opposite the emission parts 12a of the filaments in other arc tubes 10 adjacently located concentrically to these arc tubes 10.

Figure 6A:
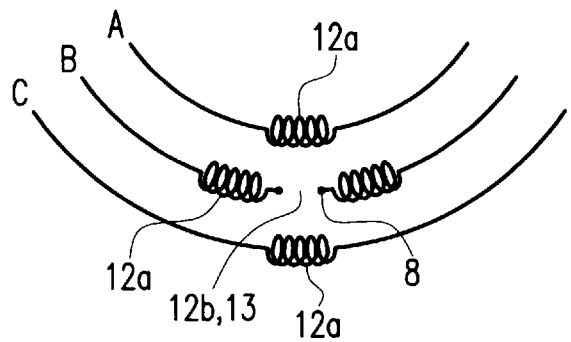
FIGS. 6(a) and (b) each shows a schematic of a respective arrangement of the areas in which there is no filament, and where there are nonemission parts of the filaments.

In FIG. 6(a), for a light source 6 in which several filaments A, B and C are arranged concentrically within the same plane, the arc tube 10 is not shown, only the filaments 12 being illustrated. In this case, the nonemission part 12b or the area 13 of the lamp B is arranged opposite the emission part 12a of the lamp A which lies inwardly of the lamp B, and opposite the emission part 12a of the lamp C which is outward of the lamp B.

Figure 6B:
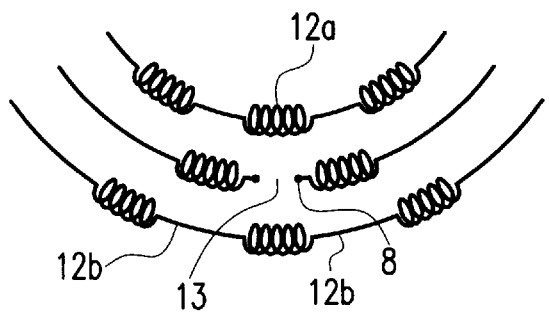

If, as a result of the great distance between two insertion tubes or for similar reasons, the radiance of the area 13 decreases to an extremely high degree, as is shown in FIG. 6(b), the coiling of the emission parts 12a of the lamps A and C which are arranged opposite the area 13 of the lamp B can be made thicker and thus the radiance can be increased. In this way, compensation is provided for the decrease of the radiance of the area 13. This measure is advantageous for making the irradiance on the wafer surface uniform.

Figure 7:
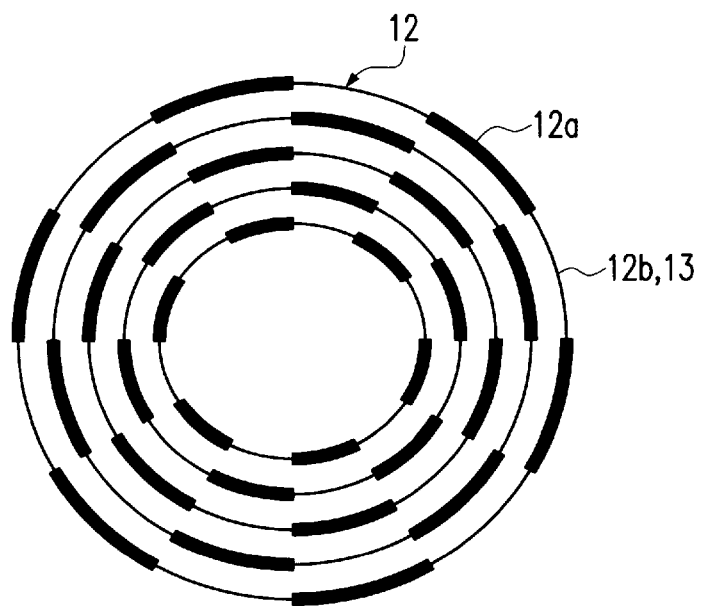
FIG. 7 is a schematic depiction of the arrangement of the areas in which there is no filament, and where there are nonemission parts of the filaments.

In FIG. 7, in a heating light source 6 in which several filaments are arranged concentrically, arc tube 10 is not shown, the filaments 12 are shown only schematically. In this case, the respective nonemission part 12b or the area 13 (the area shown using the thinner line) is opposite, i.e., faces, the emission part 12a of another lamp adjacent to this lamp (the area shown using the thicker line).

By the arrangements as shown in FIGS. 6(a), 6(b) and FIG. 7, in each radial direction the emission parts 12a with strong radiance, the nonemission parts 12b with weaker radiance and the area 13 are also distributed in the radial direction in an alternating manner and are not present only on one side. The difference of the irradiance on the wafer surface thus becomes less than in the conventional example. Therefore, this prevents the irradiance from dropping in one part in the radial direction. As a result, the wafer surface can be heated to an essentially uniform temperature.

While various embodiments in accordance with the present invention have been shown and described, it is understood that the invention is not limited thereto, and is susceptible to numerous changes and modifications as known to those skilled in the art. Therefore, this invention is not limited to the details shown and described herein, and includes all such changes and modifications as are encompassed by the scope of the appended claims.

ACTION OF THE INVENTION

As was described above, the following effects can be achieved through utilization of the present invention:

(1) A large current and thus also a large device are not necessary due to the filament lamp 4 of the light source 6 with annular filaments 12, even if it is used as the light source of a heating device.

(2) By the annular filament lamp 4 in which the nonemission parts 12b are distributed in the peripheral direction and are not arranged on one side, the nonemission parts 12b have a radiance which is controlled such that the irradiance on the wafer surface directly underneath the area 13 in the vicinity of the insertion tube 8 essentially agrees with the irradiance of the wafer directly underneath the nonemission parts 12b. This measure enables the difference of irradiance on the wafer surface to be reduced and the wafer to be heated to an essentially uniform temperature.

(3) In a light source 6 in which several such filament lamps 4 are arranged concentrically within the same plane, these nonemission parts and areas 13 in the vicinity of the insertion tubes are distributed in the radial direction of the light source 6 and are not located only on one side. This measure reduces the difference of the irradiance on the wafer surface. Thus, the wafer surface can be heated to an essentially uniform temperature.

What we claim is:

1. Light source for wafer heating comprising a plurality of arc tubes, said arc tubes being arranged with the annular tube portions thereof disposed concentrically within a single plane; wherein each of said arc tubes is formed of an annular tube portion and two insertion tube portions which project outwardly from a plane in which the annular tube portion is situated, and a filament with emission parts and nonemission parts disposed within the arc tube; wherein the emission parts and the nonemission parts are arranged alternatingly in the annular tube portion of the arc tube; wherein areas between the insertion tubes having no filament and the nonemission parts of the filaments of each of said plurality of arc tubes are circumferentially shifted in said plane with respect to the areas between the insertion tubes having no filament and the nonemission parts of the filaments each radially adjacent arc tube in a manner locating each of said areas between the insertion tubes having no filament and the nonemission parts of the filaments facing the emission parts of the filaments in other of said arc tubes that are radially adjacent thereto.

2. A The light source for wafer heating as claimed in claim 1, wherein the filament is made as a tightly wound filament coil in the emission parts and is made as an unwound or more loosely wound filament coil in the nonemission parts.

3. The light source for wafer heating as claimed in claim 1, wherein each of said plurality of arc tubes is further formed with transitional regions between the annular tube portion and each of the two insertion tube portions, the emission parts of the filament being also located in the transition regions.

4. The light source for wafer heating as claimed in claim 1, wherein the emission parts of the filaments of the other of said arc tubes which are located facing the areas in the vicinity of the insertion tube in which there is no filament, have greater radiance than the other emission parts thereof.

\* \* \* \* \*

UNITED STATES PATENT AND TRADEMARK OFFICE
CERTIFICATE OF CORRECTION

PATENT NO. : 6,081,072
DATED : June 27, 2000
INVENTOR(S) : Shinji Suzuki

It is certified that error appears in the above-identified patent and that said Letters Patent is hereby corrected as shown below:

<u>Title page,</u>
Item [22], the filing date of "December 15, 1998" should be -- December 14, 1998 --.

Signed and Sealed this

Sixteenth Day of October, 2001

*Attest:*

NICHOLAS P. GODICI
*Attesting Officer*   Acting Director of the United States Patent and Trademark Office